(12) United States Patent
Katagiri

(10) Patent No.: US 9,673,070 B2
(45) Date of Patent: Jun. 6, 2017

(54) DUST COLLECTING MECHANISM FOR GROOVE MACHINING HEAD AND GROOVE MACHINING APPARATUS

(71) Applicant: MITSUBOSHI DIAMOND INDUSTRIAL CO., LTD, Settsu, Osaka (JP)

(72) Inventor: Naoki Katagiri, Osaka (JP)

(73) Assignee: MITSUBOSHI DIAMOND INDUSTRIAL CO., LTD, Osaka (JP)

( * ) Notice: Subject to any disclaimer, the term of this patent is extended or adjusted under 35 U.S.C. 154(b) by 105 days.

(21) Appl. No.: 14/699,287

(22) Filed: Apr. 29, 2015

(65) Prior Publication Data

US 2015/0348808 A1  Dec. 3, 2015

(30) Foreign Application Priority Data

May 29, 2014 (JP) ................................ 2014-110811
Dec. 26, 2014 (JP) ................................ 2014-265596

(51) Int. Cl.
*H01L 21/67* (2006.01)
*B28D 7/02* (2006.01)

(52) U.S. Cl.
CPC .......... *H01L 21/67092* (2013.01); *B28D 7/02* (2013.01); *Y10T 83/207* (2015.04)

(58) Field of Classification Search
CPC ... H01L 21/67092; B28D 7/02; Y10T 83/207; B23Q 11/0046
USPC ............. 33/18.1; 83/168, 100; 173/197, 198
See application file for complete search history.

(56) References Cited

U.S. PATENT DOCUMENTS

| 4,738,571 | A | * | 4/1988 | Olson | B23Q 11/0046 408/67 |
| 5,988,954 | A | * | 11/1999 | Gaskin | B23Q 11/0046 408/67 |
| 7,134,817 | B2 | * | 11/2006 | Kado | B23Q 11/0046 408/16 |
| 7,326,878 | B2 | * | 2/2008 | Odanaka | B23K 26/16 219/121.84 |
| 7,591,615 | B2 | * | 9/2009 | Li | B26D 7/018 408/207 |
| 8,235,773 | B2 | * | 8/2012 | Yin | B23Q 11/0046 451/451 |
| 8,393,939 | B2 | * | 3/2013 | Chianese | B23Q 11/0046 451/453 |
| 8,763,617 | B2 | * | 7/2014 | Lenkeit | B08B 15/04 134/104.2 |

(Continued)

FOREIGN PATENT DOCUMENTS

JP  H09-285938 A  11/1997
JP  H09-285939 A  11/1997

(Continued)

*Primary Examiner* — Christopher Fulton
(74) *Attorney, Agent, or Firm* — McGlew and Tuttle, P.C.

(57) ABSTRACT

A groove machining head has a dust collecting hood 40 having a suction port in the vicinity where tools 32 protrude from a bottom plate 33 of the groove machining head. When performing groove machining on a substrate W using the groove machining head 30, a blower 35 sucks air inside the dust collecting hood 40 through ducts 34. Doing so can suck dust produced by the groove machining through the suction port of the dust collecting hood 40 before attachment of the dust on the substrate W.

9 Claims, 8 Drawing Sheets

(56) References Cited

U.S. PATENT DOCUMENTS

| | | | |
|---|---|---|---|
| 8,793,835 B2 * | 8/2014 | King, Jr. .............. | B23D 59/006 15/339 |
| 9,144,884 B2 * | 9/2015 | Mase .................... | B24C 7/0038 |
| 9,440,344 B2 * | 9/2016 | Ikuta ................... | B23Q 11/0046 |
| 2010/0200117 A1 * | 8/2010 | Glogger ............. | B23Q 11/0046 144/252.1 |

FOREIGN PATENT DOCUMENTS

| | | |
|---|---|---|
| JP | 2005-191167 A | 7/2005 |
| JP | 2010-245255 A | 10/2010 |
| JP | 2011-155151 A | 8/2011 |

\* cited by examiner

F I G. 1
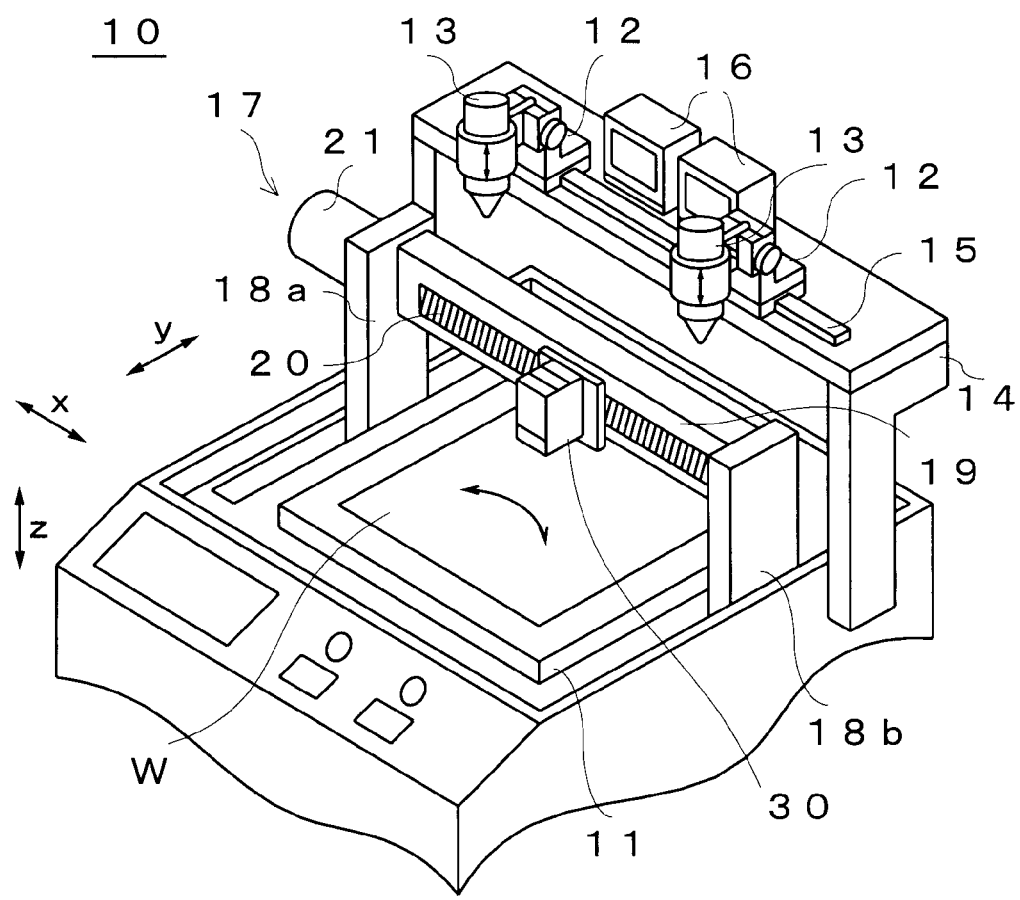

F I G. 4
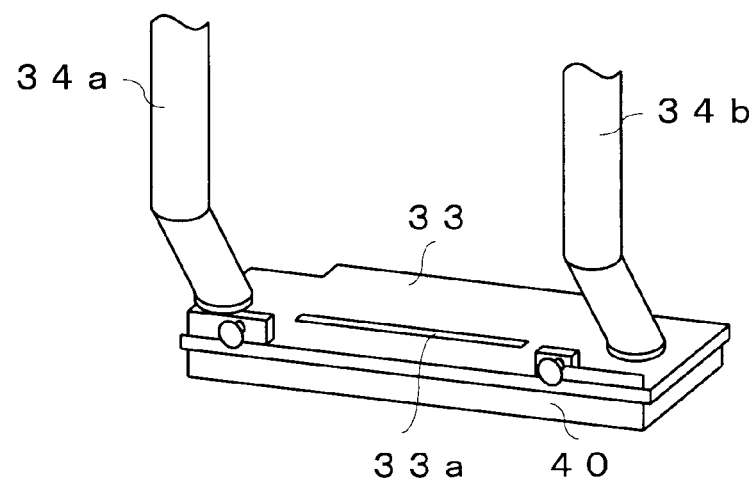
F I G. 5
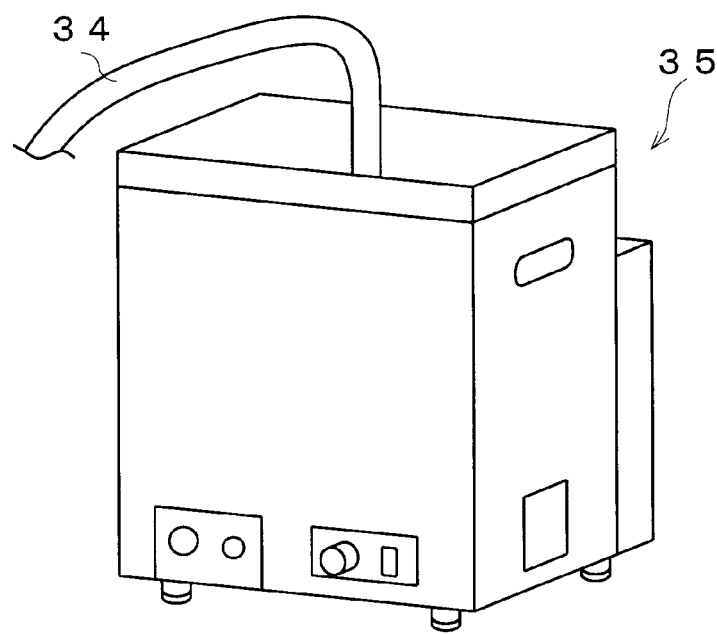

DUST COLLECTING MECHANISM FOR GROOVE MACHINING HEAD AND GROOVE MACHINING APPARATUS

BACKGROUND OF THE INVENTION

1. Field of the Invention

The present invention relates to dust collecting mechanism for a groove machining head collecting dust produced when performing groove machining on a thin film, such as when manufacturing thin film solar cells or other devices, and to a groove machining apparatus.

2. Discussion of the Related Art

A manufacturing process for an integrated solar cell includes steps of stacking semiconductor thin films on a substrate and repeating patterning multiple time as described in, for example, Japanese Unexamined Patent Publication JPA2005-191167. This manufacturing process includes forming a metallic lower electrode layer on the brittle material substrate, and as a patterning P1, cutting and dividing the electrode layer into rectangles using a laser beam. Then, forming a P-type light absorption layer and a buffer layer on the patterned electrode layer gives an integrated semiconductor thin film. After that, as a patterning P2, mechanically scribing parts of the stack of the buffer layer and the P-type light absorption layer along lines slightly displaced from grooves formed as the patterning P1 is cut and divided into rectangles. Then a transparent conductive film made of metal oxide on the buffer layer is formed. Subsequently, as a patterning P3, mechanically scribing parts of the stack of the transparent conductive film, the buffer layer, and the P-type light absorption layer along lines slightly displaced from grooves formed as the patterning P2 is cut and divided into rectangles. The thin film solar cell is manufactured in this manner. For this purpose, it is necessary to slightly displace the lines formed as each of the patterning P2 and P3 from the lines formed as the patterning P1, and it is also necessary to form one hundred and several tens parallel grooves at pitches of, for example, approximately 5 mm in one substrate.

Japanese Unexamined Patent Publications JPA2011-155151 and JPA2010-245255 disclose a scribing apparatus for solar cells. The scribing apparatus disclosed in JPA2011-155151 includes, on a base for a scribing head, a tool holder adapted to hold a machining tool, an air cylinder adapted to move the tool holder up and down, a spring adapted to cancel out the weight of the tool holder, and the like, and presses the tool against a workpiece while adjusting a load using the air cylinder. Also, JPA2010-245255 discloses the scribing apparatus that simultaneously performs scribing in multiple positions by attaching a number of heads to a sliding mechanism on a beam.

Japanese Unexamined Patent Publication JPA-Hei9-285939 proposes a dust collecting device that provides a tool head with a dust collector having a fan in order to eliminate swarf from a machine tool.

As Japanese Unexamined Patent Publications JPA2005-191167, JPA2011-155151, and JPA2010-245255 disclose, scribing along patterning lines with a scriber produces dust. In the process of the scribing, once the dust attaches to a thin film solar cell substrate, there arises a problem of the difficulty to remove the dust, or even in the case of successfully removing the dust, damaging the surface of the substrate. Further, although the dust collecting device in JPA-Hei9-285939 has a suction head adapted to suck dust around a rotary tool, rotating the fan gives arise to a problem of complicated structure.

SUMMARY OF THE INVENTION

The present invention intends to provide a dust collecting mechanism for groove machining head capable of effectively removing dust produced by scribing before attachment of the dust to the surface of a substrate, and a groove machining apparatus using the dust collecting mechanism.

The dust collecting mechanism for groove machining head of the present invention comprises: a groove machining head; a dust collecting hood that attaches to a lower part of said groove machining head; and a dust collector that sucks air from said dust collecting hood through at least a duct, wherein said groove machining head has a plurality of tool holders, each of which holds a tool of which a tool edge faces downward, and said dust collecting hood is a case of which an upper surface opens; has an opening through which said tool of said groove machining head protrudes, and a frame-shaped partition set that attaches upward from said opening at a fixed distant from said tool holder; and attaches such that a tip of said tool protrudes downward through said opening.

In the dust collecting mechanism for groove machining head, the dust collecting hood may have a bottom surface of a V-shape around a suction port of said opening.

In the dust collecting mechanism for groove machining head, fore ends of end surfaces of suction ports of said opening and said partition set of the dust collecting hood may be sharply cut.

In the dust collecting mechanism for groove machining head, said dust collecting hood may further have at least one a triangular prism-shaped straightening block in a corner inside said dust collecting hood.

The groove machining apparatus of the present invention comprises: a table that mounts a substrate; the dust collecting mechanism for groove machining head according to the present invention to which a plurality of tool holders having tools for groove machining attach; and moving mechanism adapted to relatively move said table and said groove machining head in a horizontal plane, said groove machining apparatus moving said groove machining head parallel to an upper surface of the substrate to form a groove in said substrate.

According to the present invention having such features, the dust collecting hood attaches to the lower part of the groove machining head, and sucks dust produced near the tool at the time of scribing. Doing so can result in an effect making it possible to suck and remove dust before attachment of the dust to a thin film solar cell substrate or the like to perform groove machining without damaging the surface of the substrate. Also, arranging the frame-shaped partition set on the bottom plate at a fixed distance from the tool holder results in an effect that when sucking dust through the duct, causes air flow from the side of the tool holder toward the tip of the tool to eliminate the risk of the mixture of dust into the tool holder.

BRIEF DESCRIPTION OF THE DRAWINGS

FIG. 1 is a perspective view of a groove machining apparatus according to embodiment 1 of the present invention;

FIG. 4 is a perspective view illustrating a bottom plate and ducts of a dust collecting mechanism according to the present embodiment;

FIG. 5 is a perspective view of a dust collector according to the present embodiment;

DESCRIPTION OF THE PREFERRED EMBODIMENTS

Figure 2:
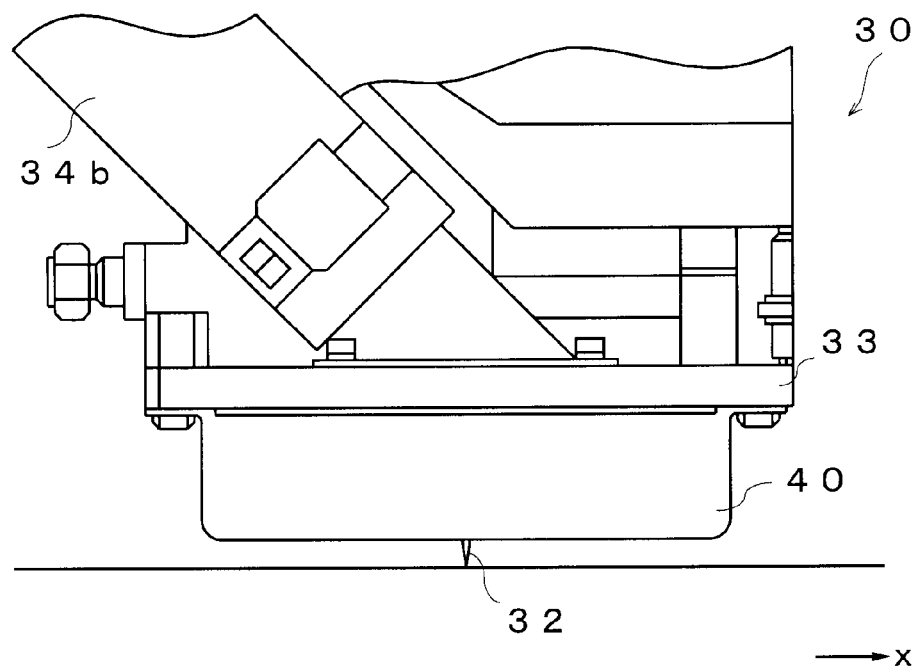
FIG. 2 is a side view illustrating a main part of a groove machining head according to the present embodiment.

FIG. 1 is a perspective view illustrating an overall configuration of a groove machining apparatus according to embodiments of the present invention. In this view, the groove machining apparatus 10 includes a table 11 that places a thin film solar cell substrate W serving as a machining target on an xy plane thereof. The table 11 is movable in a y direction in FIG. 1 in the horizontal plane (xy plane), and also rotatable at an arbitrary angle in the horizontal plane.

Above the table 11, cameras 13 respectively attach to two bases 12. Each of the bases 12 is movable along a guide 15 extending in an x direction on a supporting base 14. The two cameras 13 are movable up and down, and monitors 16 respectively display corresponding images photographed by the cameras 13.

A bridge 17 provided above the table 11 has a pair of supporting columns 18a and 18b, a guide bar 19 provided between the supporting columns in the x axis direction, and a motor 21 adapted to drive a guide 20 formed in the guide bar 19. The bridge 17 holds a groove machining head 30 movably along the guide 20 in the x direction in the horizontal plane. Note that the guide 20 and the motor 21 provided to the bridge 17 constitute a moving mechanism adapted to relatively move the machining head in the x axis direction in the horizontal plane. The groove machining head 30 holds a number of tool holders 31 in parallel at a regular interval.

Figure 3:
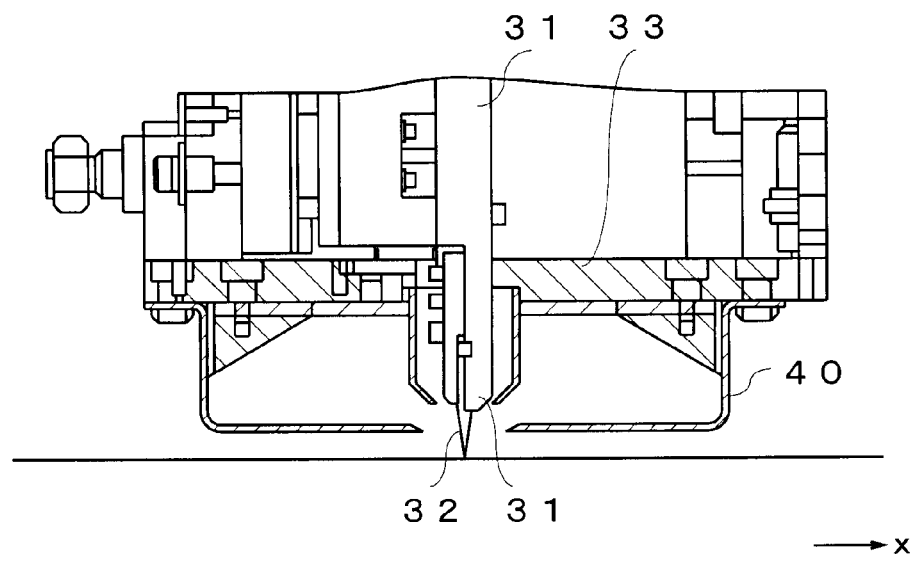
FIG. 3 is a vertical cross-sectional view illustrating the main part of the groove machining head according to the present embodiment.

The following is a description of the groove machining head according to embodiments of the present invention. FIG. 2 is a diagram illustrating part of the groove machining head having a dust collecting mechanism, and FIG. 3 is a cross-sectional view of the groove machining head. As these views illustrate, the groove machining head 30 holds a number of tool holders 31 in a direction vertical to the paper surface. Each of the tool holders is of an elongate rectangular parallelepiped shape, and holds a tool 32 at the lower end. Note that the tool 32 is of a columnar shape having a tapered tool edge with a sharp tip. The groove machining head 30 forms a pattern in the surface of a substrate by bringing the tools 32 contact with the substrate while applying a constant load to the tools 30, and moving the tools 30 along the surface of the substrate.

FIG. 4 is a perspective view illustrating a bottom plate and ducts of the groove machining head, and FIG. 5 illustrates a dust collector set at the fore end of a duct. As FIG. 4 illustrates, as the lower surface of the groove machining head 30, a bottom plate 33 is set. The bottom plate 33 has an elongate opening 33a in the center thereof along the longer direction. Also, the bottom plate 33 has a pair of openings on the outer sides of the opening 33a of the bottom plate 33, and the pair of ducts 34a, 34b attach to the openings at a tilt. As shown in FIG. 5, dust collector 35 has blower a that connects to a duct 34. The duct 34 branched out into the pair of ducts 34a, 34b. The dust collector 35 is one that sucks air through the ducts 34a, 34b. Note that the present embodiment uses the duct collector, but may use only the blower.

Figure 6:
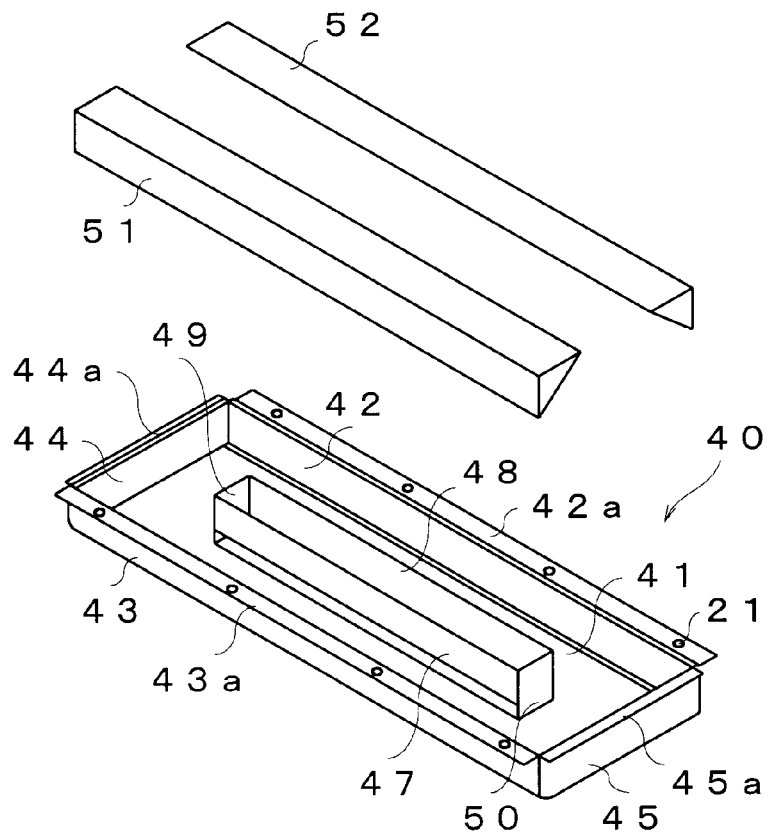
FIG. 6 is a perspective view of a dust collecting hood according to the present embodiment.
Figure 7:
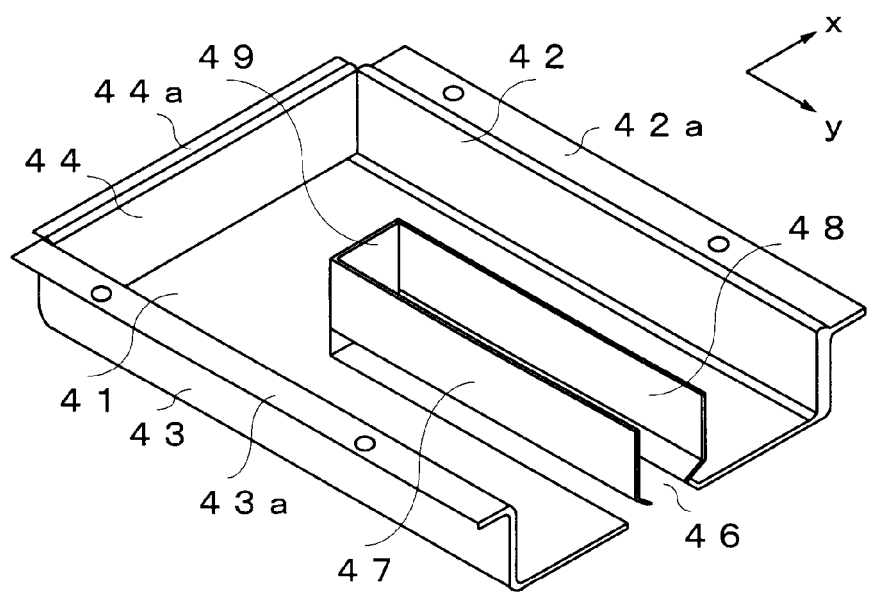
FIG. 7 is a perspective view of the dust collecting hood according to the present embodiment, which is cut along the centerline in the shorter direction.

Under the bottom plate 33, a dust collecting hood 40 is set for sucking dust when using the tools 32 to perform scribing. FIG. 6 is a perspective view illustrating the dust collecting hood 40 and straightening blocks attaching to the upper part of the dust collecting hood 40, and FIG. 7 is a perspective view illustrating the dust collecting hood 40 cut along the centerline in the shorter direction. As these views illustrate, the dust collecting hood 40 is a case-shaped member having a bottom plate 41, vertical wall plates 42 to 45 on all four sides, and an opened upper surface. The bottom plate 41 has an elongate opening in the center along the longer direction. Also, the wall plates 42 and 43 have fold parts 42a and 43a folding outward at the upper ends thereof, respectively. The fold parts 42a and 43a have multiple through-holes for screw fixation of the dust collecting hood 40 to the bottom plate 33 of the groove machining head 30. Similarly, the wall plates 44 and 45 also have outward fold parts 44a and 45a at the upper ends thereof, respectively. These fold parts 42a, 43a, 44a, and 45a are parts for, when sucking air using the dust collector 35 with the dust collecting hood 40 attaching to the bottom plate 30, preventing air from leaking in from gaps in attachment areas.

Inside the dust collecting hood 40, there is a partition set 46. The partition set 46 includes partition plates 47 to 50 parallel to the wall plates 43, 42, 44, and 45, respectively, and these partition plates 47 to 50 form into a frame. Between the opening of the bottom plate 41 and the lower parts of the partition plates 47 and 48, there are narrow slits, which serve as air suction ports.

Figure 8:
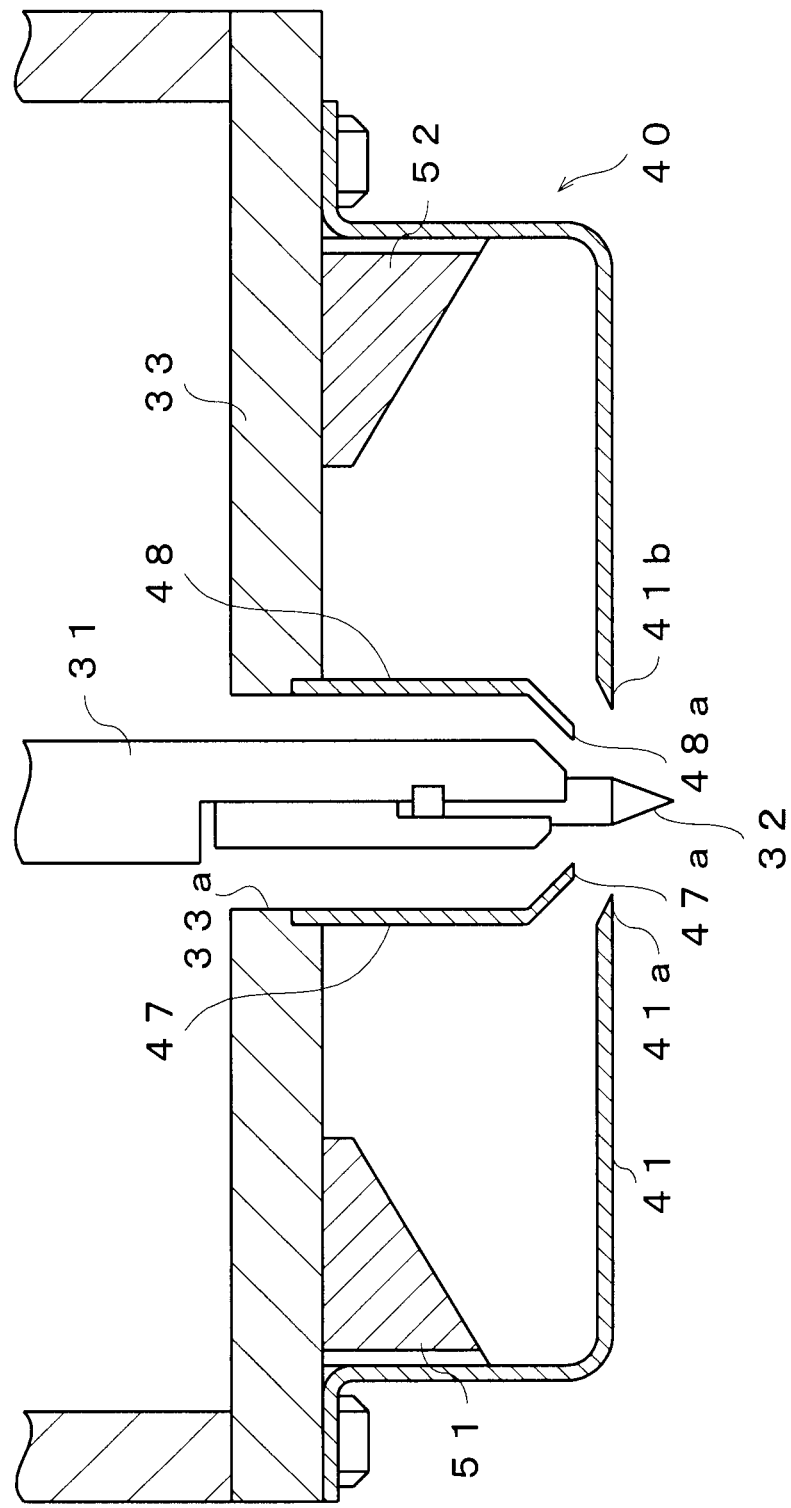
FIG. 8 is a cross-sectional view of the dust collecting hood attaching to the groove machining head according to the present embodiment, which is cut along the centerline in the shorter direction.

FIG. 8 is an enlarged cross-sectional view illustrating the details of the dust collecting hood 40 and partition set 46. As this view illustrates, the lower end parts of the partition plates 47 and 48 slightly tilt inward, i.e., toward the center. For this reason, the elongate slits between the partition plates 47 and 48 and the bottom plate 41 face toward the tools 32. Further, the bottom plate 41 has obliquely cut end parts 41a and 41b facing to the central opening, and consequently the lower surfaces of the end parts 41a and 41b are of a sharp shape toward the tool holders 31 and the tools 32 held at the fore ends of the tool holders 31. In addition, the partition plates 47 and 48 also respectively have lower end parts 47a and 48a having sharply cut tips facing to the tool holders 31. Without sharply cutting the end parts, dust may deposit on the end parts; however, sharply cutting the respective end parts can make the inflow and outflow of air smooth as well as making dust smoothly flow into the dust collecting hood 40 without attachment of the dust to the end parts.

The groove machining head 30 has the multiple tool holders arrayed at regular intervals with the tool edges facing downward. When attaching the dust collecting hood 40, the multiple tools fall within a frame-shaped space formed by the partition set 46 so as to keep limited gaps with the partition plates 47 to 50.

Also, inside the dust collecting hood 40 and along the long sides of the dust collecting hood 40, at least one straightening block of a substantially triangular prism shape is set on the lower surface of the head. In this embodiment, two blocks 51 and 52 are set on the lower surface. The two right-angle surfaces of each of the straightening blocks 51 and 52 attach to the inner wall upper part of the dust collecting hood 40 and the lower surface of the bottom plate 33, and the oblique surface faces to the inside of the dust collecting hood 40. The straightening blocks 51 and 52 are ones adapted to straighten a flow of air to guide the flow into the ducts 34 without depositing dust on any of the inner corners of the dust collecting hood 40 when sucking air.

Figure 9A:
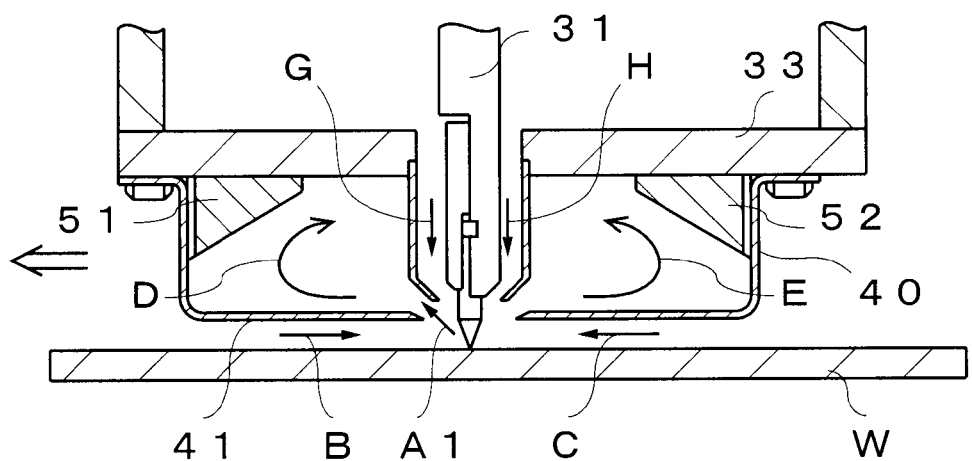
FIGS. 9A and 9B are diagrams illustrating air flows at the time of using the groove machining head according to the present embodiment to perform groove machining.

Meanwhile, in the case of performing groove machining using the groove machining head, the first step is to arrange a thin film solar cell substrate W on a table 11 as FIG. 1 illustrates. Then, the next step is to move the groove machining head 30 to one end in an x axis direction, followed by controlling a position of the tool of each head unit of the groove machining head in a z axis direction. The following step is to drive the motor 21 to move the groove machining head 30 along the x axis. In the case of attaching columnar tools to the groove machining head, relatively moving the substrate W and the groove machining head scribes the substrate W without tilting the groove machining head. Accordingly, as FIG. 9A illustrates, relatively moving the groove machining head to the right side peels off a thin film in the surface of the substrate W in a direction indicated by an arrow A1. At this point, driving the blower of the dust collector 35 sucks air inside the dust collecting hood 40 through the ducts 34. Air near the tools 32 is under negative pressure, and therefore air between the lower surface of the dust collecting hood 40 and the substrate W moves in directions indicated by arrows B and C, resulting in suction of air into the dust collecting hood 40 through the narrow gaps between the end parts 41a and 47a and between 41b and 48a. Produced dust gets into the dust collecting hood 40 together with air, making it possible to exhaust the dust outside directly through the ducts 34 before attachment of the dust on the substrate. Since the dust collecting hood 40 has the straightening blocks 51 and 52 inside, air inside the dust collecting hood 40 moves like arrows D and E, making it possible to surely discharge the dust outside without attachment of the dust on any of the corners of the dust collecting hood 40.

When doing this, the suction by the dust collector causes the negative pressure in the narrow gap between the end parts 41a and 47a and sucks air not only from the opening of the bottom plate 41 but also from the inside of the partition set 46, and consequently air flows downward between the partition plates 47 and 48 and the tool holders 31 as arrows G and H indicate to cause air flow toward the tips of the tools. For this reason, dust is unlikely to attach to the tool holders 31, making it possible to eliminate the adverse effect due to attachment of dust to the tool holders. In order to easily suck air from the inside of the partition set 46 for this purpose, it is desirable to position the end parts 47a and 48a, i.e., the lower ends of the partition plates 47 and 48 above the end parts 41a and 41b, respectively.

As FIG. 2 illustrates, the ducts 34 attach to the upper part of the bottom plate 33 so as to face obliquely upward on the outer sides of the opening of the bottom plate 33 and the opening of the bottom plate 41 as viewed from the x axis direction that is a machining direction. As described, by displacing the positions of the ducts 34 and the opening of the partition set 46 from each other as viewed from the x axis direction, even in the case where dust attaching to the inside of any of the ducts 34 drops off, the dust is unlikely to fall from the opening of the bottom plate 41 even in the presence of acceleration/deceleration in the x axis direction along with a machining action or a change in air flow. Also, since the ducts 34 obliquely attach, even in the case where dust attaching to the inside of any of the ducts 34 drops off, the dust once contacts with the oblique part of the duct 34, making it possible to suppress the dust from falling toward the dust collecting hood 40. Further, for partitioning between the ducts 34 and the opening of the bottom plate 41, there are the partition plates 49 and 50 connecting to the bottom plate 41. For this reason, the partition plate 49 or 50 can block dust from dropping off from any of the ducts 34 to the bottom plate 41 to suppress the dust from falling from the opening of the bottom plate 41. This can consequently prevent the dust dropping off from the duct 34 from falling from the opening and attaching on the substrate.

Figure 9B:
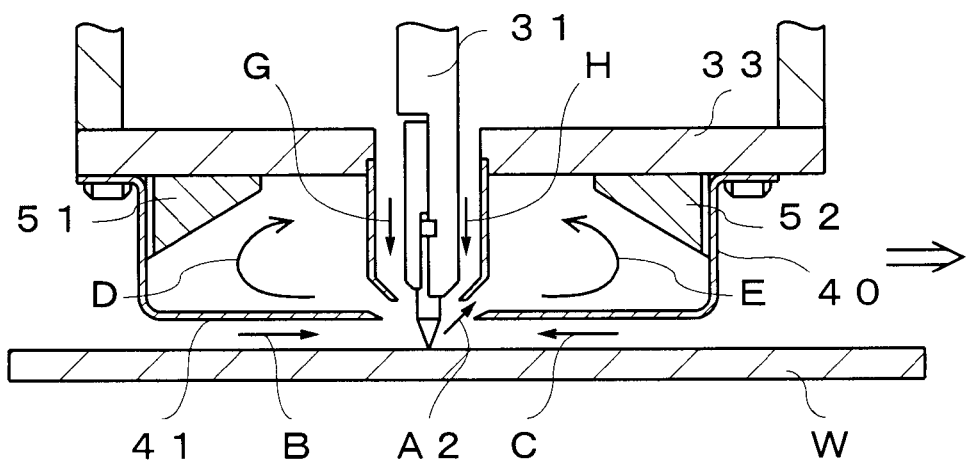

On the other hand, as FIG. 9B illustrates, relatively moving the groove machining head in the opposite direction peels off a thin film to produce dust in a direction indicated by an arrow A2. In this case as well, the dust gets into the dust collecting hood 40 through the narrow gap between the end parts 41b and 48a together with air flows indicated by arrows B to E, resulting in exhausting the dust outside through the ducts 34. As described, even scribing in any of the directions can result in exhausting dust without attaching the dust on the substrate W.

Thus, after scribing the thin film solar cell substrate W to simultaneously form a number of grooves, and finishing the formation of the grooves in the x axis direction, slightly moving up each head block, then displacing the table 11 in the y axis direction, and moving down each head block again to repeat groove machining can form patterns P1, P2, and P3 at narrow intervals.

Figure 10:
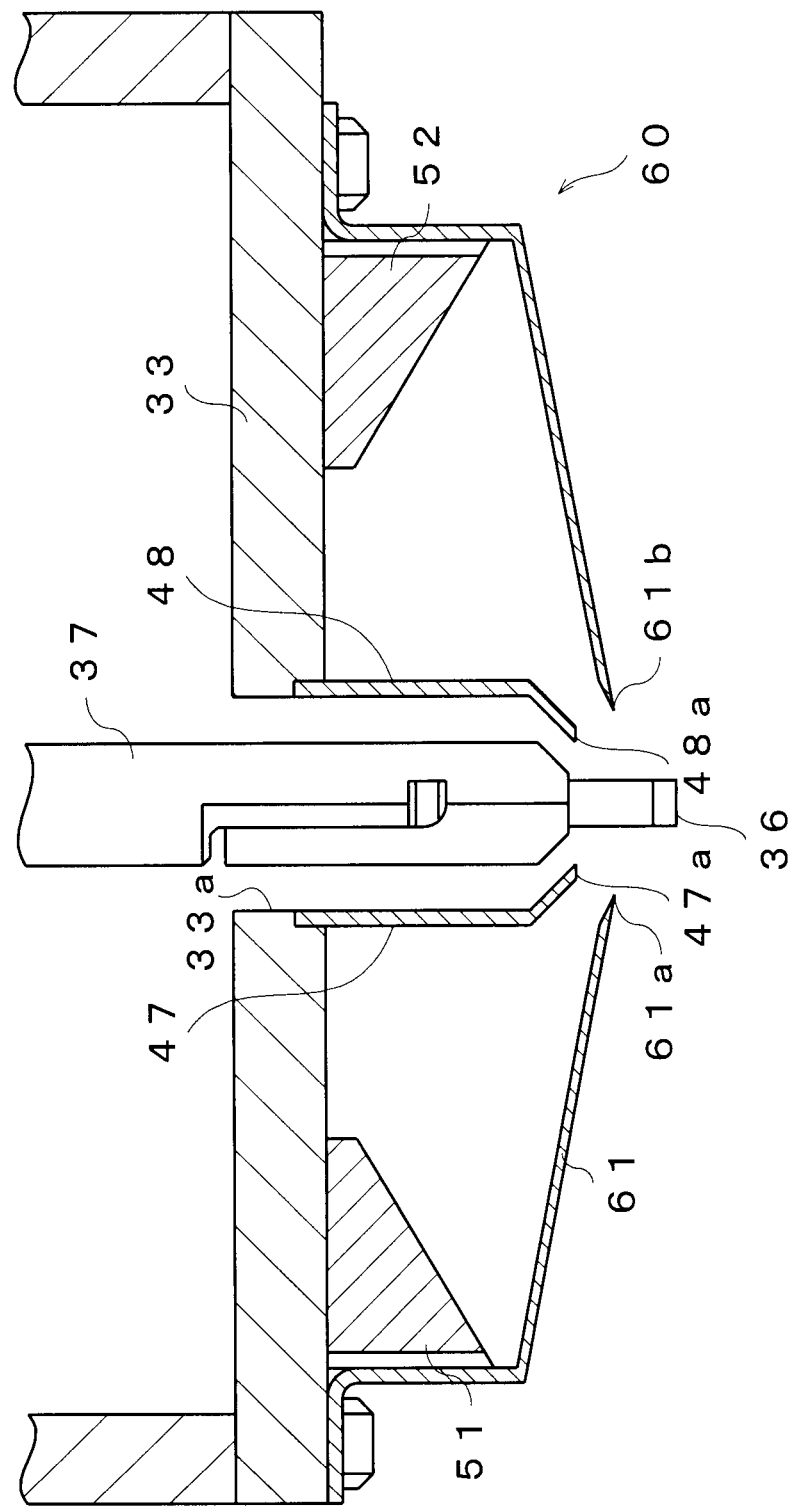
FIG. 10 is a cross-sectional view illustrating a main part of a dust collecting hood according to embodiment 2 of the present invention.

Next description is an embodiment 2 of the present invention. A groove machining head according to this embodiment employs prism-shaped tools 36 as tools and tool holders 37 adapted to hold the tools 36. A required step in the case of using the prism-shaped tools is to slightly tilt the groove machining head with respect to a substrate for use. Accordingly, as FIG. 10 illustrates, a bottom plate 61 of a dust collecting hood 60 is formed in a shallow V-shape. In this case as well, the bottom plate 61 has sharply cut end parts 61a and 61b facing to an opening. The rest of a configuration is the same as that of the groove machining head of embodiment 1. A tilt angle of the V-shape corresponds to a tilt of the groove machining head at the time of scribing.

Figure 11A:
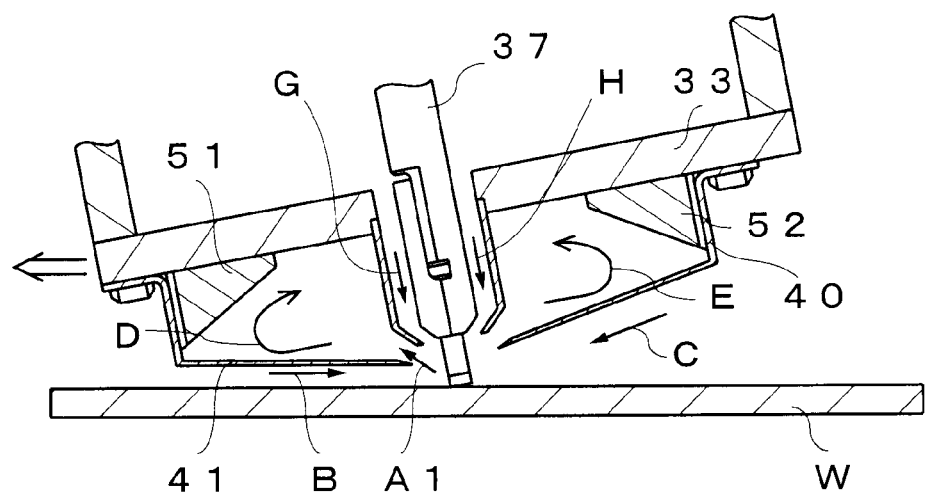
FIGS. 11A and 11B are diagrams illustrating air flows at the time of using a groove machining head according to the present embodiment to perform groove machining.
Figure 11B:
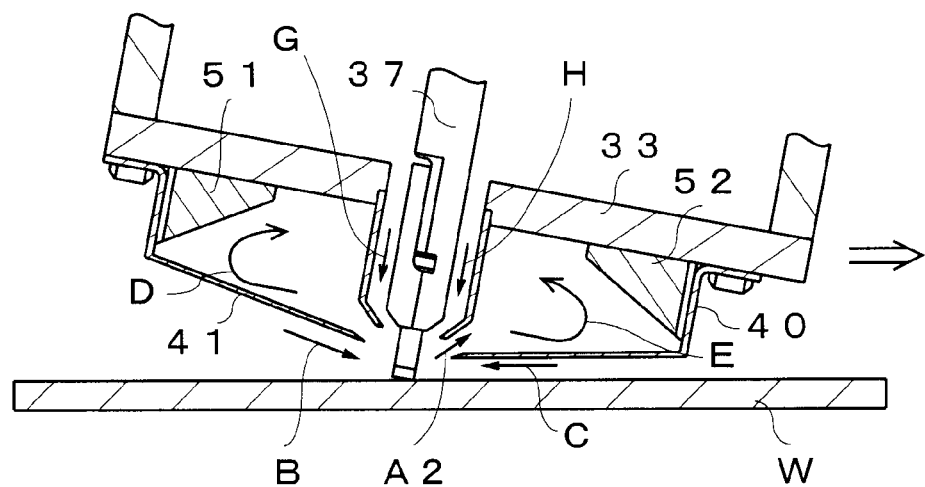

In doing so, as FIGS. 11A and 11B illustrate, when performing groove machining with the groove machining head 30 tilting, one bottom surface of the dust collecting hood 60 becomes parallel to the surface of the substrate. As described, making the substrate and one bottom surface of the dust collecting hood 60 parallel to each other causes air flows as arrows A1 to H or A2 to H indicate similarly to embodiment 1 described above, making it possible to surely and efficiently take dust, which is produced when performing groove machining, into the dust collecting hood 60 even in the case of performing scribing in any direction.

This groove machining head is capable of removing dust produced when performing groove machining by attaching the dust collecting hood to the lower part of the groove machining head, and is therefore preferably usable for various machining apparatuses such as a groove machining apparatus for solar cells.

The text of Japanese application No. 2014-110811 filed on May 29, 2014 and the text of Japanese application No. 2014-265596 filed on Dec. 26, 2014 are hereby incorporated by reference.

What is claimed is:

1. A dust collecting mechanism for groove machining head comprising:
   a groove machining head;
   a dust collecting hood that attaches to a lower part of said groove machining head; and
   a dust collector that sucks air from said dust collecting hood through at least a duct, wherein
   said groove machining head has at least a tool holder, which holds a tool of which a tool edge faces downward,
   said dust collecting hood is a case of which an upper surface opens, said dust collecting hood has an opening through which said tool of said groove machining head protrudes, and said dust collecting hood attaches such that a tip of said tool protrudes downward through said opening, and
   a fore end of an end surface of a suction port of said opening of said dust collecting hood is sharply cut.

2. The dust collecting mechanism for groove machining head according to claim 1, wherein
   said dust collecting hood has a bottom surface of a V-shape around a suction port of said opening.

3. A groove machining apparatus comprising:
   a table that mounts a substrate;
   the dust collecting mechanism for groove machining head according to claim 2 to which at least a tool holder having at least a tool for groove machining attach; and
   moving mechanism adapted to relatively move said table and said groove machining head in a horizontal plane,
   said groove machining apparatus moving said groove machining head parallel to an upper surface of the substrate to form a groove in said substrate.

4. The dust collecting mechanism for groove machining head according to claim 1, wherein
   said dust collecting hood has a frame-shaped partition set that attaches upward from said opening at a fixed distance from said tool holder, and a fore end of an end surface of a suction port of said partition set of said dust collecting hood is sharply cut.

5. A groove machining apparatus comprising:
   a table that mounts a substrate;
   the dust collecting mechanism for groove machining head according to claim 4 to which at least a tool holder having at least a tool for groove machining attach; and
   a moving mechanism adapted to relatively move said table and said groove machining head in a horizontal plane,
   said groove machining apparatus moving said groove machining head parallel to an upper surface of the substrate to form a groove in said substrate.

6. The dust collecting mechanism for groove machining head according to claim 1, wherein
   said dust collecting hood further has at least a triangular prism-shaped straightening block in a corner inside said dust collecting hood.

7. A groove machining apparatus comprising:
   a table that mounts a substrate;
   the dust collecting mechanism for groove machining head according to claim 6 to which at least a tool holder having at least a tool for groove machining attach; and
   moving mechanism adapted to relatively move said table and said groove machining head in a horizontal plane,
   said groove machining apparatus moving said groove machining head parallel to an upper surface of the substrate to form a groove in said substrate.

8. A groove machining apparatus comprising:
   a table that mounts a substrate;
   the dust collecting mechanism for groove machining head according to claim 1 to which at least a tool holder having at least a tool for groove machining attach; and
   moving mechanism adapted to relatively move said table and said groove machining head in a horizontal plane,
   said groove machining apparatus moving said groove machining head parallel to an upper surface of the substrate to form a groove in said substrate.

9. The dust collecting mechanism for groove machining head according to claim 1, wherein said dust collecting hood has a frame-shaped partition set that attaches upward from said opening at a fixed distance from said tool holder, said frame-shaped partition set comprising a partition set suction port and an end portion having a sharp surface, said sharp surface defining at least a portion of said partition set suction port.

* * * * *